US012250813B2

(12) United States Patent
Nakane et al.

(10) Patent No.: US 12,250,813 B2
(45) Date of Patent: Mar. 11, 2025

(54) METHOD OF FORMING MEMORY TRANSISTOR WITH SACRIFICIAL POLYSILICON LAYER

(71) Applicants: Kabushiki Kaisha Toshiba, Tokyo (JP); Toshiba Electronic Devices & Storage Corporation, Tokyo (JP)

(72) Inventors: Yu Nakane, Kawasaki Kanagawa (JP); Nobuyuki Toda, Kawasaki Kanagawa (JP); Hiroyoshi Kitahara, Yokohama Kanagawa (JP); Takeshi Yamamoto, Kawasaki Kanagawa (JP); Naozumi Terada, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/366,353

(22) Filed: Aug. 7, 2023

(65) Prior Publication Data

US 2023/0389307 A1    Nov. 30, 2023

Related U.S. Application Data

(62) Division of application No. 17/670,999, filed on Feb. 14, 2022.

(30) Foreign Application Priority Data

Sep. 17, 2021   (JP) ................................. 2021-152203
Dec. 9, 2021    (JP) ................................. 2021-200121

(51) Int. Cl.
*H10B 41/30*   (2023.01)
*H01L 29/66*   (2006.01)
(Continued)

(52) U.S. Cl.
CPC ....... *H10B 41/30* (2023.02); *H01L 29/66825* (2013.01); *H01L 29/66833* (2013.01);
(Continued)

(58) Field of Classification Search
CPC ...................................... H10B 41/30
See application file for complete search history.

(56) References Cited

U.S. PATENT DOCUMENTS 5,953,611 A     9/1999  Tanaka
10,651,188 B2   5/2020  Yamakoshi et al.
(Continued)

FOREIGN PATENT DOCUMENTS

JP   H09321255 A    12/1997
JP   2016146508 A    8/2016
JP   2018-170444 A  11/2018

OTHER PUBLICATIONS

Nathan Cheung, "Thermal properies of Si", https://web.archive.org/web/20150121212852/http://www.eng.tau.ac.il/~yosish/courses/vlsi1/1-4-1-Oxidation.pdf (2013).*
(Continued)

*Primary Examiner* — Peter Bradford
(74) *Attorney, Agent, or Firm* — Kim & Stewart LLP

(57) ABSTRACT

According to the present embodiment, a semiconductor device includes a semiconductor substrate, a memory transistor, and a MOS transistor. The memory transistor includes at least a first silicon dioxide film and a first gate electrode positioned on the semiconductor substrate in order. The MOS transistor includes a second silicon dioxide film and a second gate electrode positioned on the semiconductor substrate in order. Any bird's beak is not generated in at least either the first silicon dioxide film or the first gate electrode of the memory transistor.

7 Claims, 23 Drawing Sheets

(51) Int. Cl.
    *H01L 29/788*     (2006.01)
    *H01L 29/792*     (2006.01)
    *H10B 43/30*     (2023.01)

(52) U.S. Cl.
    CPC .......... *H01L 29/788* (2013.01); *H01L 29/792* (2013.01); *H10B 43/30* (2023.02)

(56) References Cited

U.S. PATENT DOCUMENTS

| | | |
|---|---|---|
| 2002/0149046 A1 | 10/2002 | Takahashi |
| 2004/0166643 A1* | 8/2004 | Doan .................. H10B 41/30 438/296 |
| 2007/0196982 A1 | 8/2007 | Eitan |
| 2008/0087943 A1 | 4/2008 | Kajimoto |
| 2014/0159122 A1 | 6/2014 | Sato |
| 2014/0264554 A1* | 9/2014 | Lim .................. H01L 29/4234 257/326 |
| 2016/0163722 A1* | 6/2016 | Chang ............... H01L 29/40114 257/316 |
| 2018/0286881 A1* | 10/2018 | Yamakoshi ............ H10B 43/30 |
| 2020/0286915 A1 | 9/2020 | Cui et al. |

OTHER PUBLICATIONS

Notice of Reasons for Refusal (Office Action) mailed Jan. 17, 2025 in Japanese Patent Application No. 2021-200121 with English machine translation, 18 pages.
Notice of Allowance mailed Dec. 20, 2024 in U.S. Appl. No. 17/670,999, 13 pages.

* cited by examiner

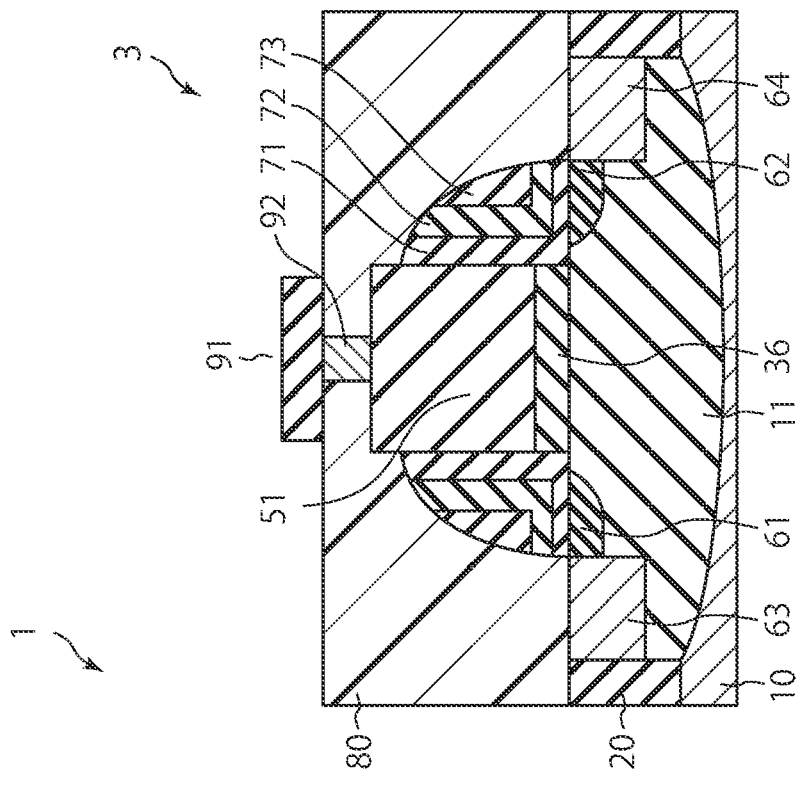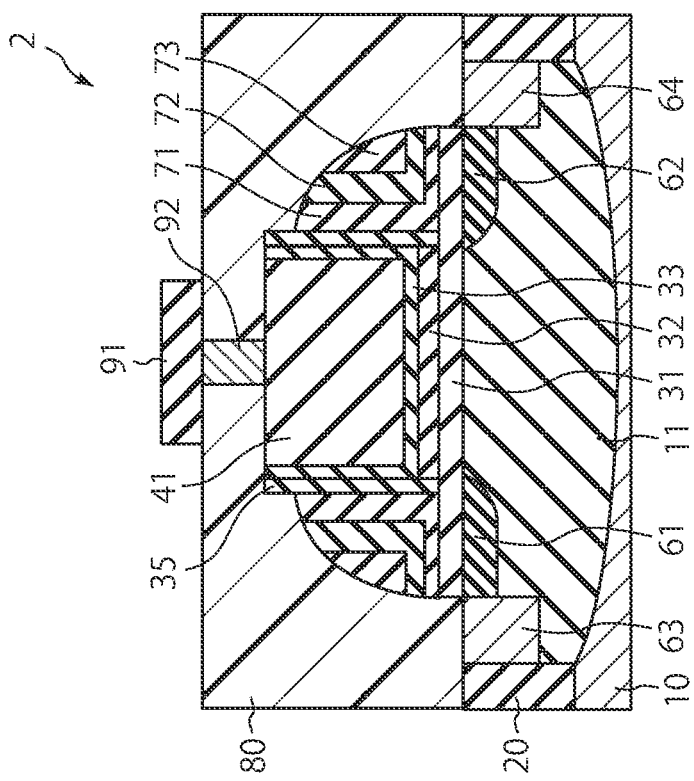
FIG. 2

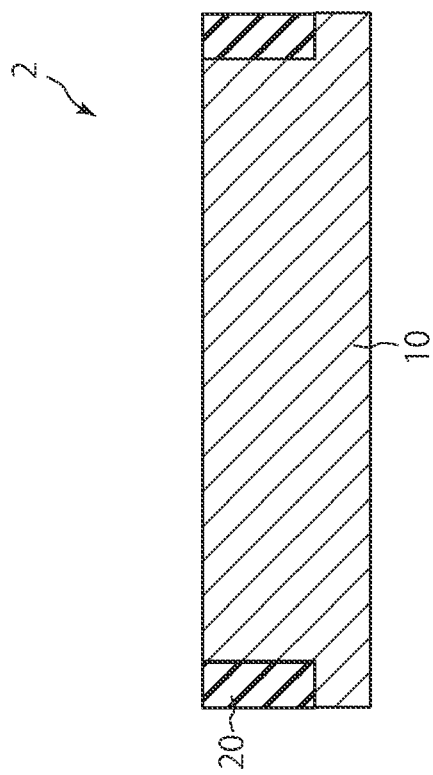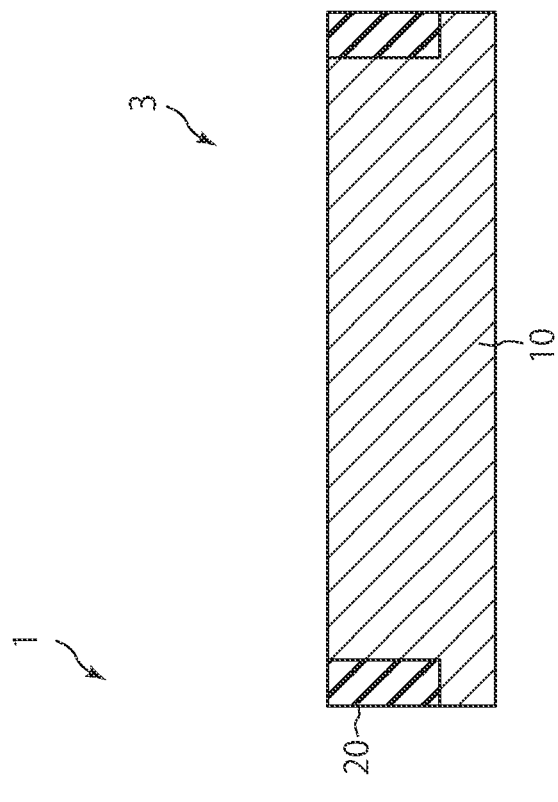
FIG. 4

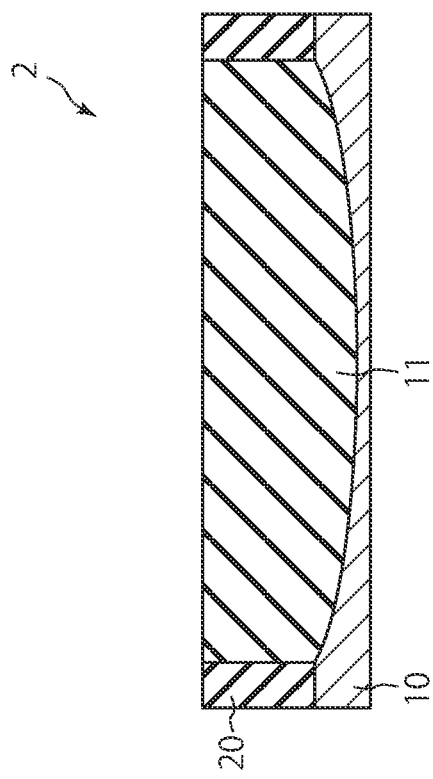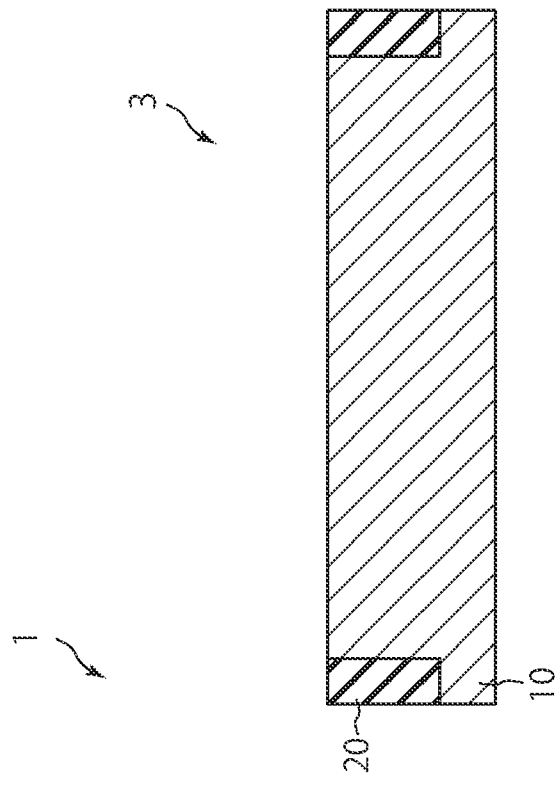
FIG. 5

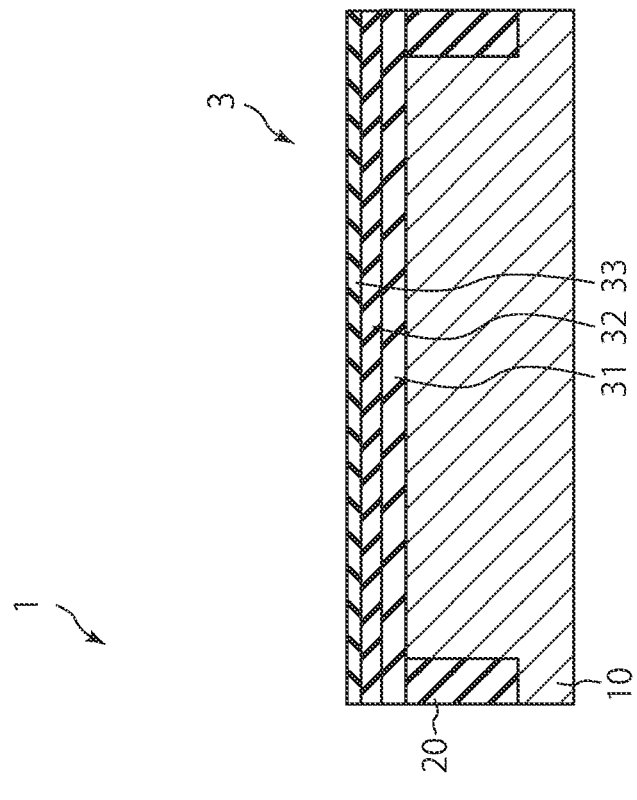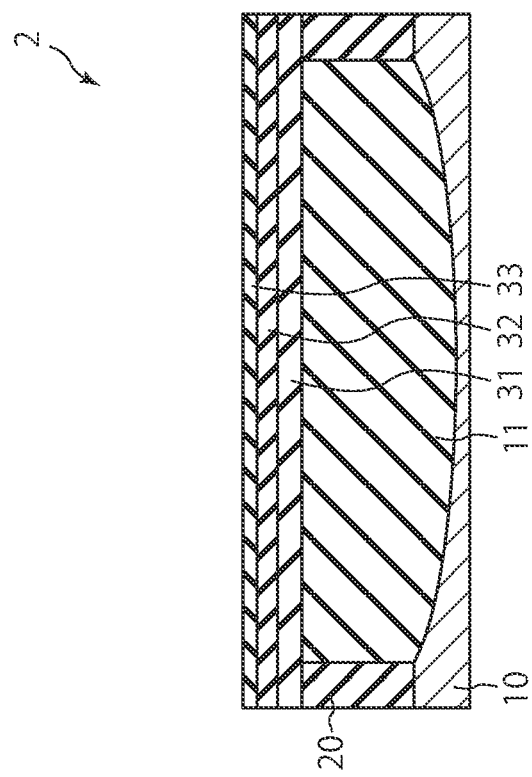
FIG. 6

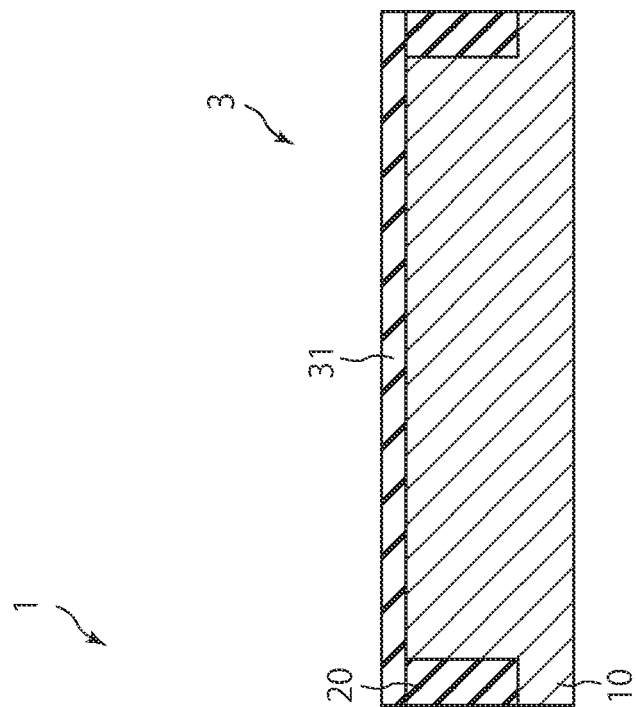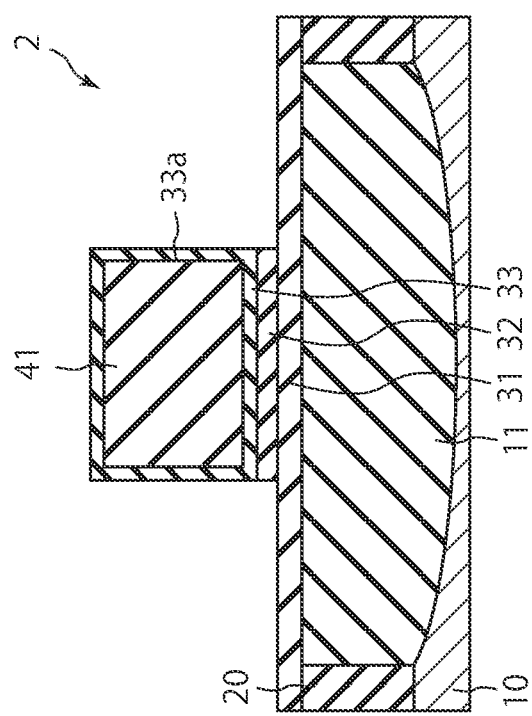
FIG. 7

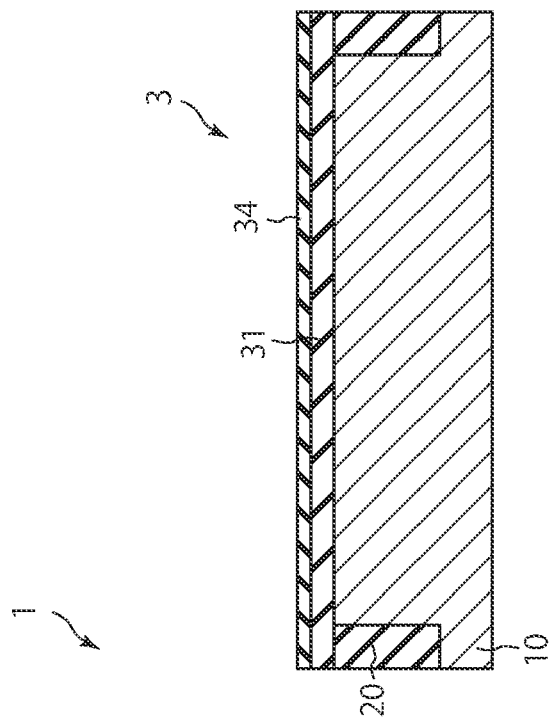
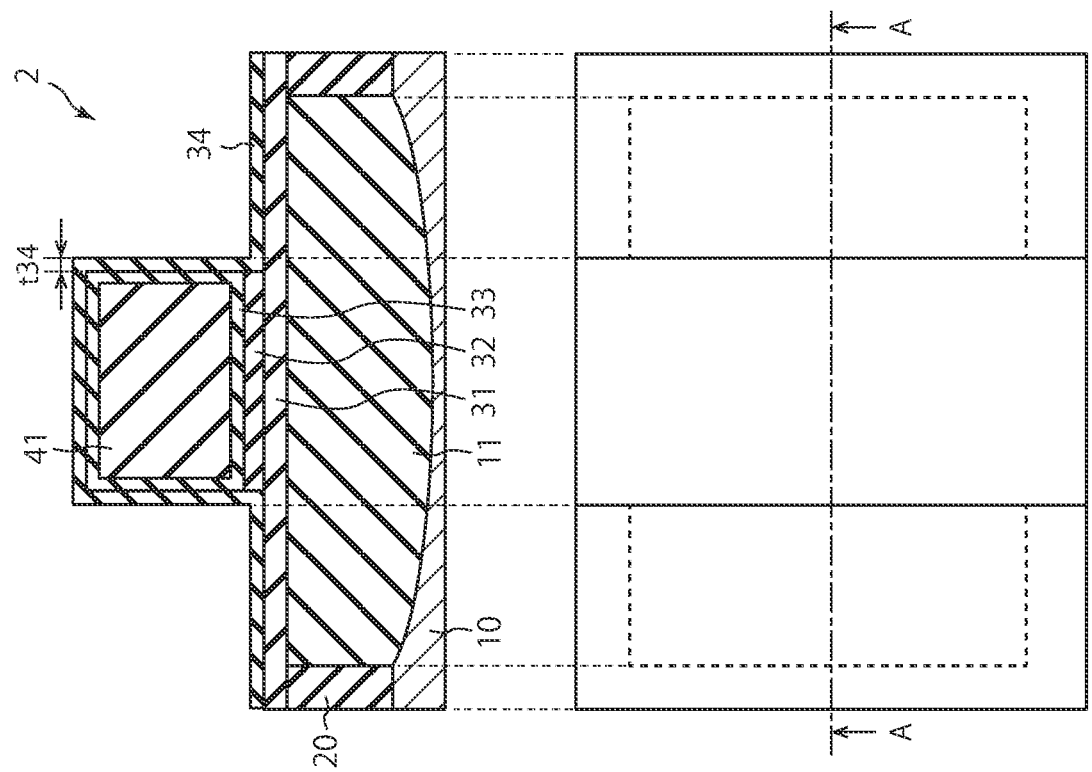
FIG. 8

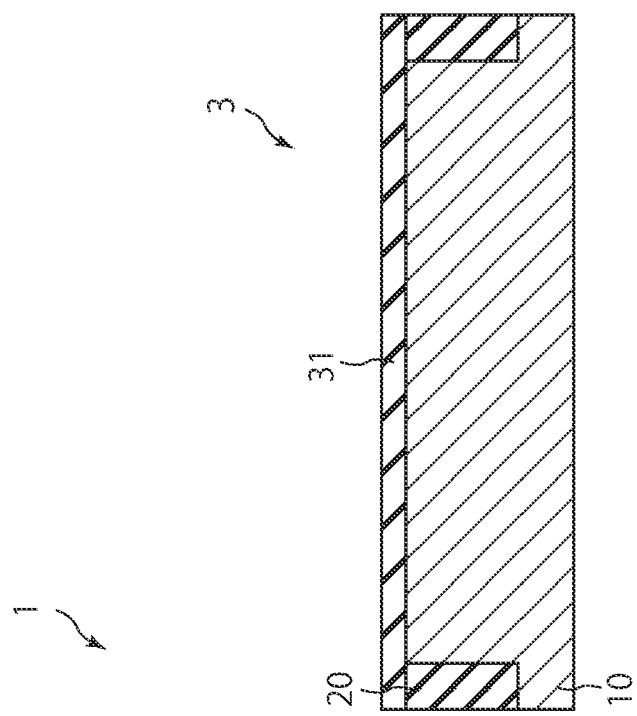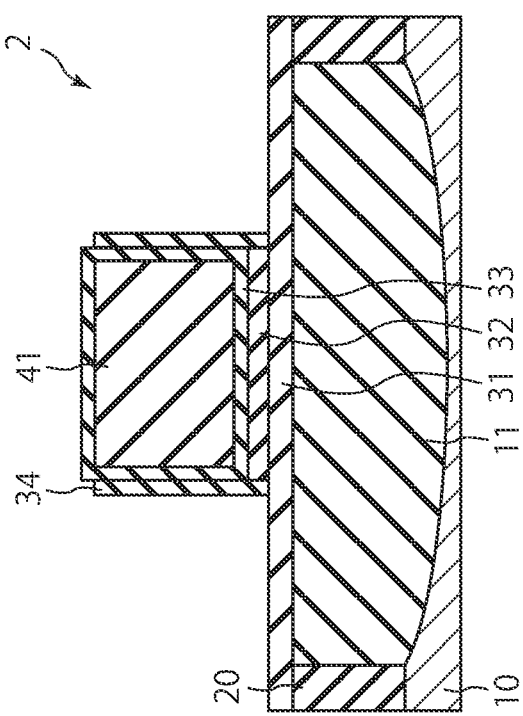
FIG. 9

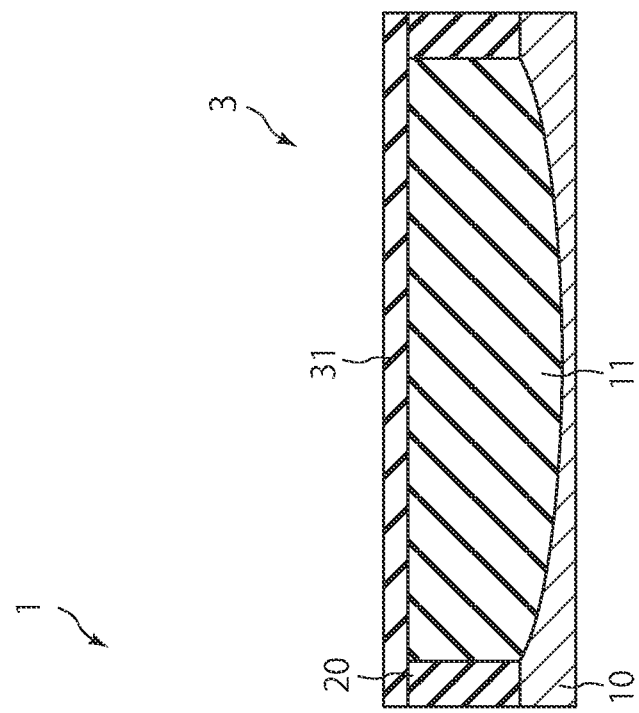
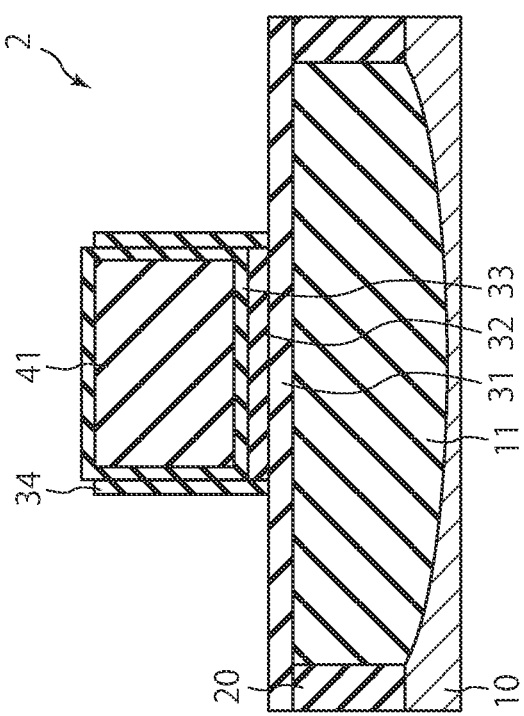
FIG. 10

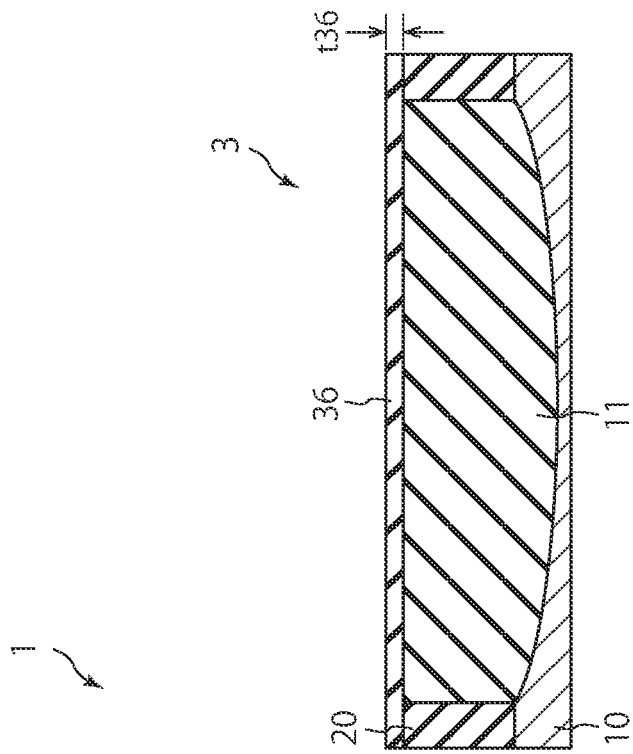
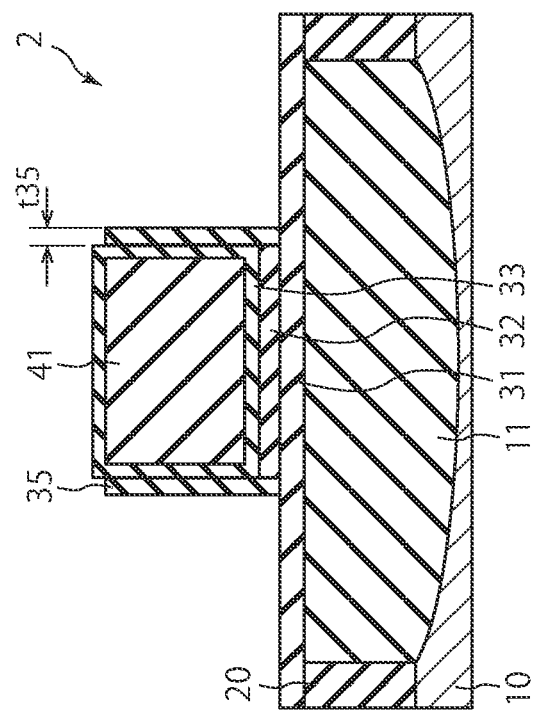
FIG. 11

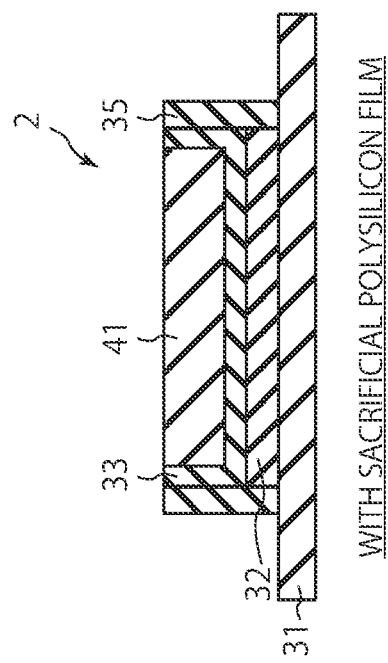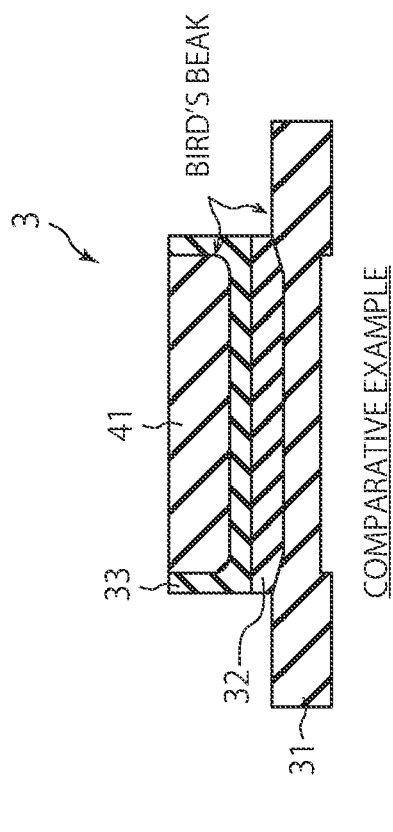
FIG. 13

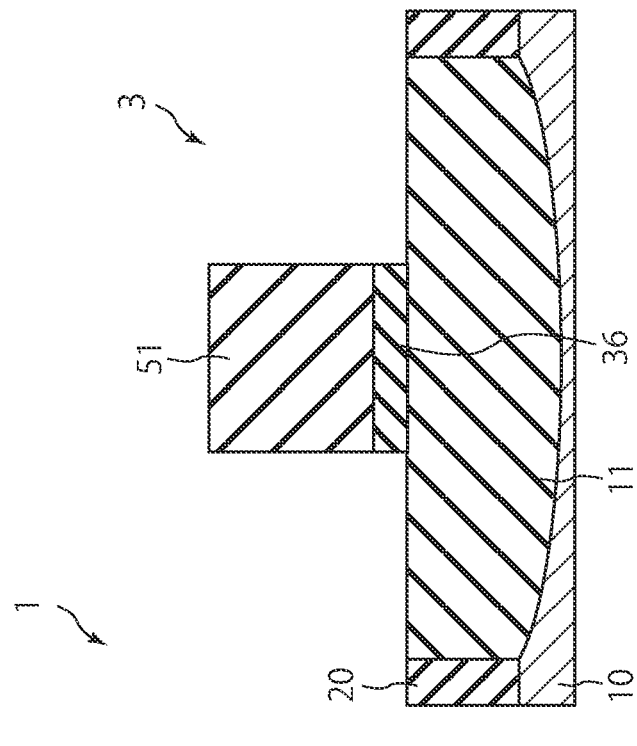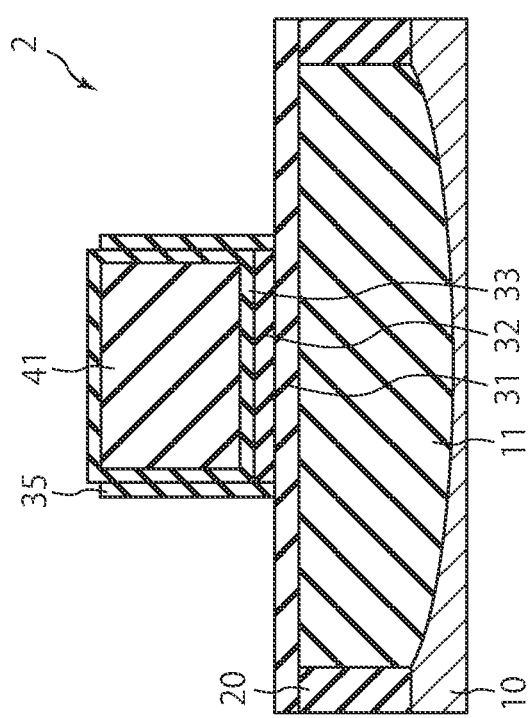
FIG. 14

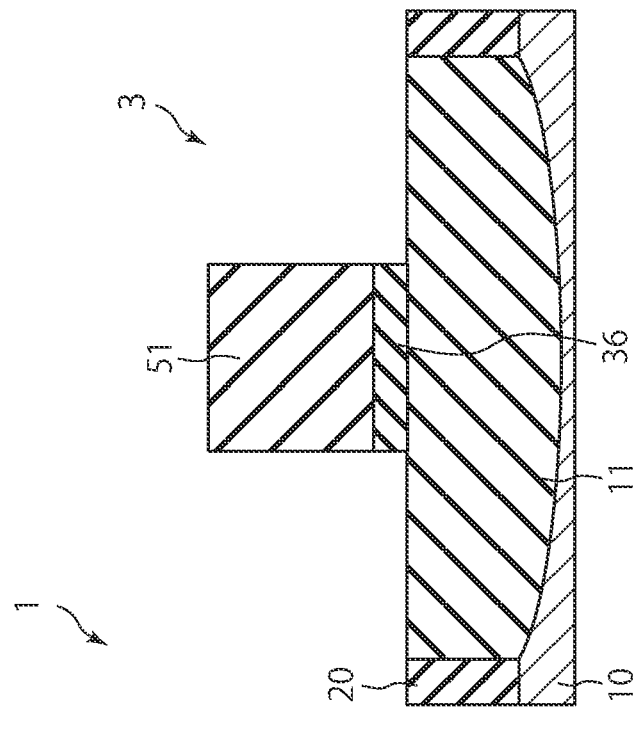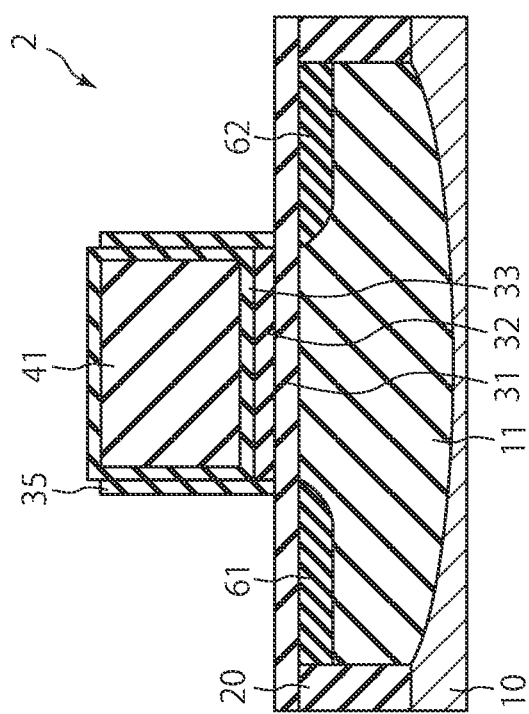
FIG. 15

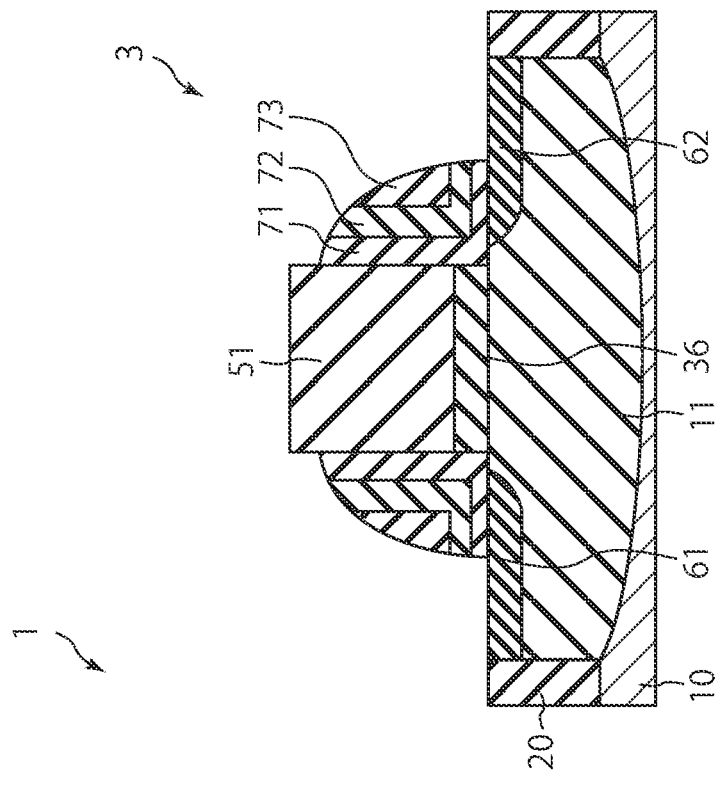
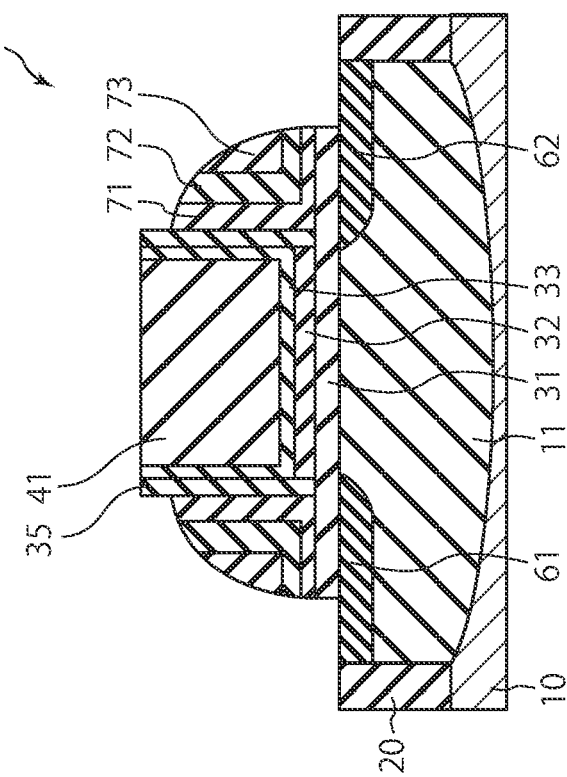
FIG. 17

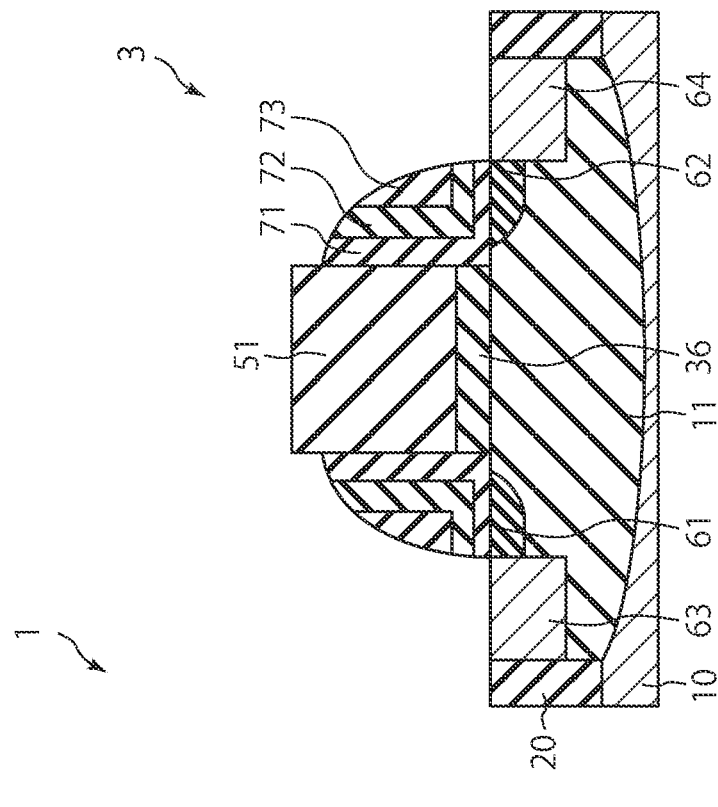
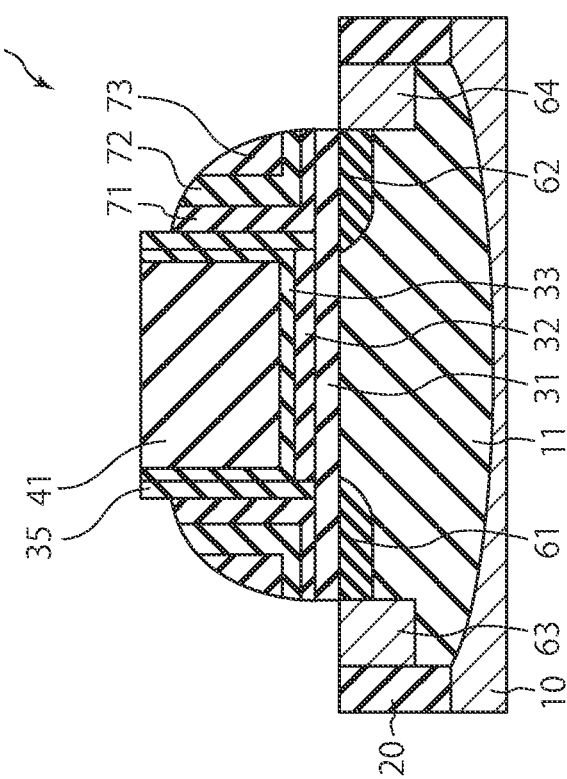
FIG. 18

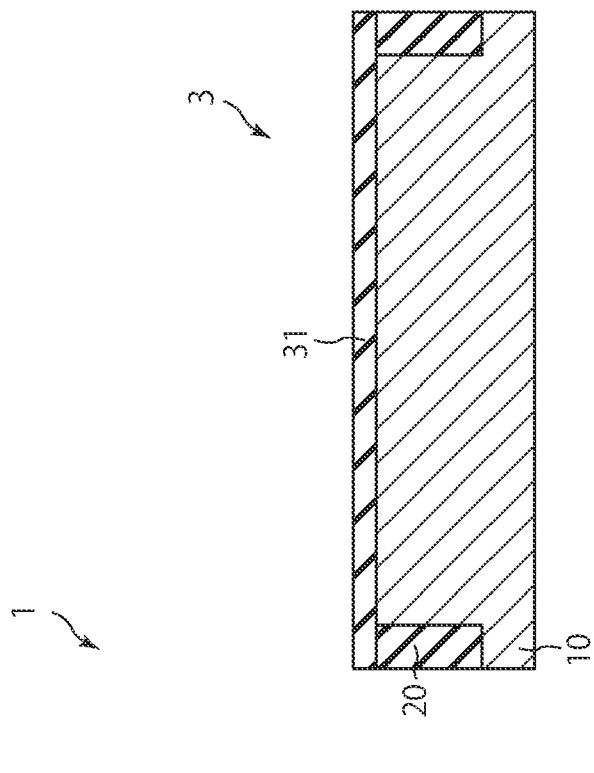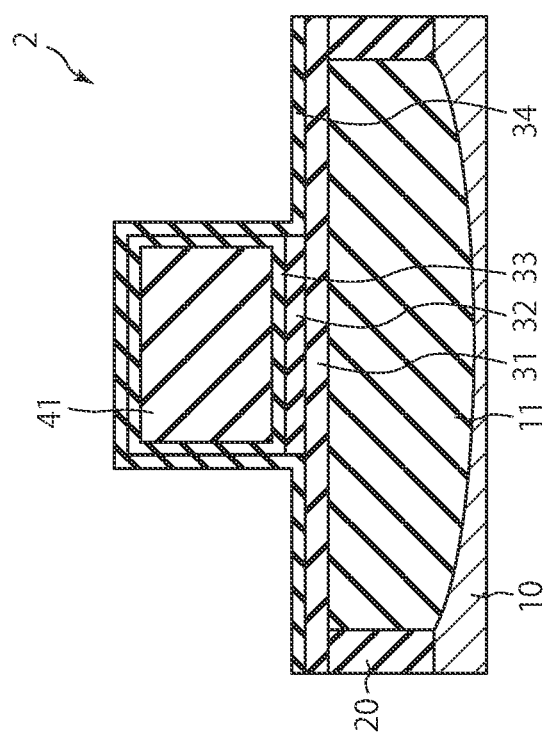
FIG. 20

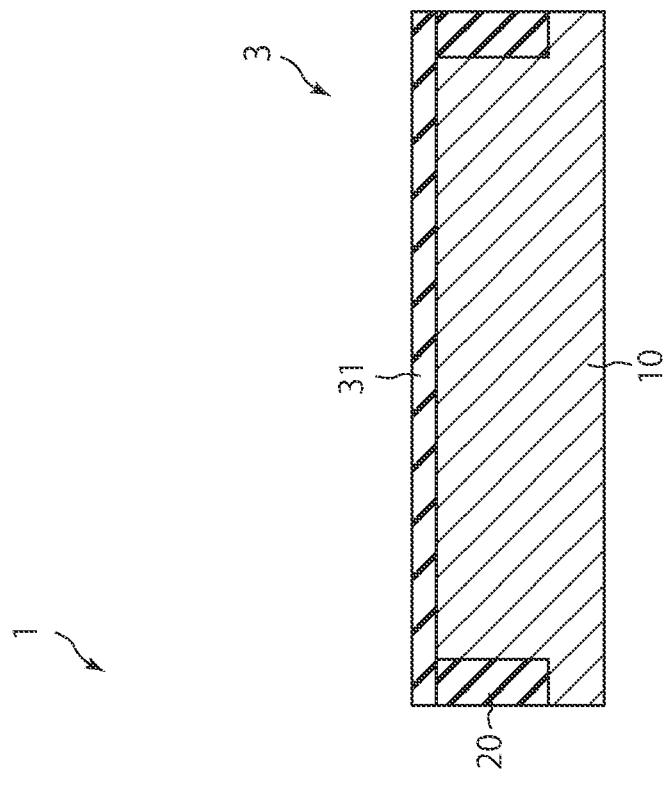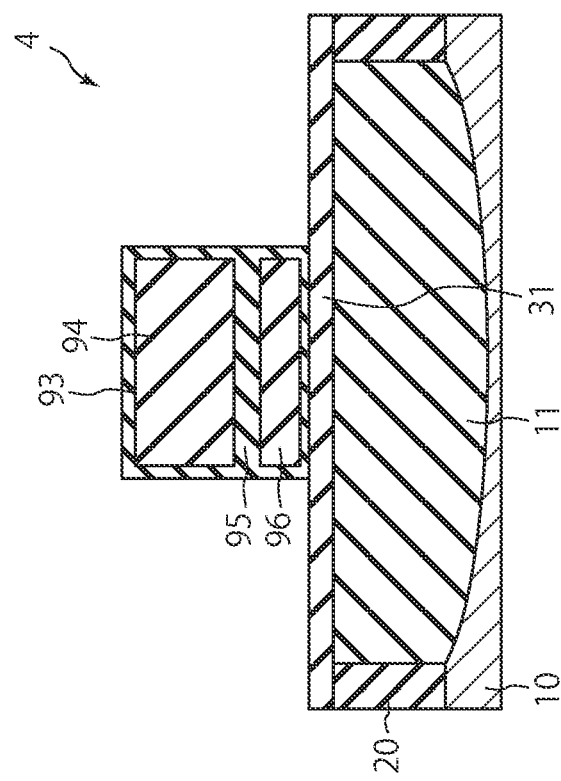
FIG. 23

METHOD OF FORMING MEMORY TRANSISTOR WITH SACRIFICIAL POLYSILICON LAYER

CROSS-REFERENCE TO RELATED APPLICATIONS

This application is a division of U.S. patent application Ser. No. 17/670,999, filed on Feb. 14, 2022, which is based upon and claims the benefit of priority from the prior Japanese Patent Applications No. 2021-152203, filed on Sep. 17, 2021, and No. 2021-200121, filed on Dec. 9, 2021, the entire contents of which are incorporated herein by reference.

FIELD

The embodiments of the present invention relate to a semiconductor device and a manufacturing method of a semiconductor device.

BACKGROUND

There are a floating gate type and a charge trap type as known types of a flash memory which is one form of non-volatile memories. Such a memory transistor and a MOS transistor of a peripheral circuit are mixedly mounted on a same substrate in some cases.

However, the memory transistor and the MOS transistor have specific manufacturing processes, respectively. Accordingly, there is a risk that a bird's beak occurs and causes characteristic deterioration of the memory transistor due to influences of oxidation treatment of the MOS transistor, which is started after the structure of the memory transistor is processed.

BRIEF DESCRIPTION OF THE DRAWINGS

FIG. 2 is a sectional view illustrating a configuration example of the semiconductor device according to the present embodiment;

FIG. 4 is a sectional view of a semiconductor substrate in a first process of the semiconductor device;

FIG. 5 is a sectional view of the semiconductor substrate in a second process of the semiconductor device;

FIG. 6 is a sectional view of the semiconductor substrate in a third process of the semiconductor device;

FIG. 7 is a sectional view of the semiconductor substrate in a fourth process of the semiconductor device;

FIG. 8 is a sectional view of the semiconductor substrate in a fifth process of the semiconductor device;

FIG. 9 is a sectional view of the semiconductor substrate in a sixth process of the semiconductor device;

FIG. 10 is a sectional view of the semiconductor substrate in a seventh process of the semiconductor device;

FIG. 11 is a sectional view of the semiconductor substrate in an eighth process of the semiconductor device;

FIG. 13 are diagrams illustrating a comparison of bird's beaks;

FIG. 14 is a sectional view of the semiconductor substrate in a ninth process of the semiconductor device;

FIG. 15 is a sectional view of the semiconductor substrate in a tenth process of the semiconductor device;

FIG. 17 is a sectional view of the semiconductor substrate in a twelfth process of the semiconductor device;

FIG. 18 is a sectional view of a semiconductor substrate in a thirteenth process of the semiconductor device;

FIG. 20 is a sectional view of the semiconductor substrate in a sixth process of the embodiment according to the first modification;

FIG. 23 is a sectional view of the semiconductor substrate in a fourth process of the semiconductor device according to the second modification of the first embodiment.

DETAILED DESCRIPTION

Embodiments of the present invention have been achieved in view of circumstances described above and are to provide a semiconductor device and a manufacturing method of a semiconductor device that can suppress characteristic deterioration due to influences of oxidation treatment.

A semiconductor device according to the present embodiment includes a semiconductor substrate, a memory transistor, and a MOS transistor. The memory transistor includes at least a first silicon dioxide film and a first gate electrode positioned on the semiconductor substrate in order. The MOS transistor includes a second silicon dioxide film and a second gate electrode positioned on the semiconductor substrate in order. Any bird's beak is not generated in at least either the first silicon dioxide film or the first gate electrode of the memory transistor.

The embodiments of the present invention will now be explained below with reference to the drawings. In the embodiments described below, characteristic configurations and operations of a semiconductor device and a manufacturing method of a semiconductor device are mainly explained. However, the semiconductor device and the manufacturing method of a semiconductor device can include characteristic configurations and operations that are omitted in the following descriptions.

First Embodiment

Figure 1:
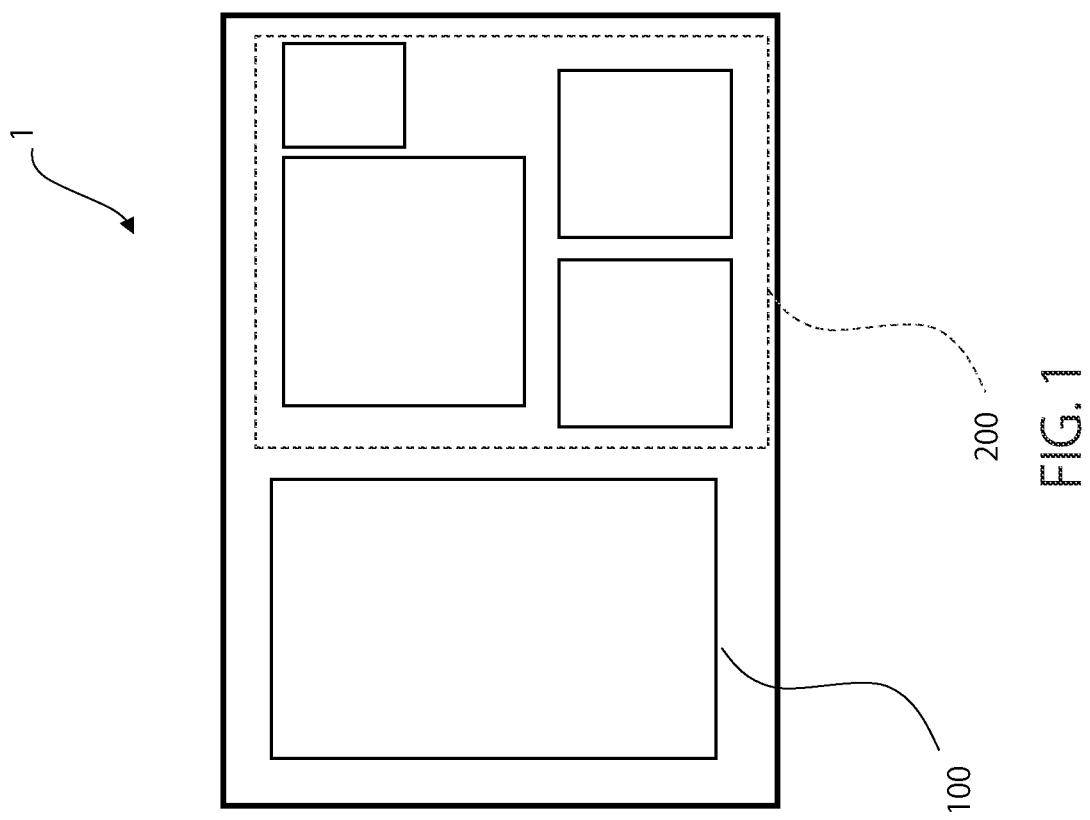
FIG. 1 is a plan view illustrating a configuration example of a semiconductor device 1.

FIG. 1 is a plan view illustrating a configuration example of a semiconductor device 1. The semiconductor device 1 includes, for example, a memory cell region 100 and a control region 200. The memory cell region 100 and the control region 200 are both formed on an upper surface of a same semiconductor substrate. The memory cell region 100 according to the present embodiment corresponds to a first region and the control region 200 according to the present embodiment corresponds to a second region.

The memory cell region 100 is, for example, a region where a non-volatile memory is formed. For example, any of a charge trap memory and a floating gate memory is formed as a non-volatile memory in the memory cell region 100. A charge trap memory and a floating gate memory are also referred to as a "charge trap memory transistor" and a "floating gate memory transistor", respectively.

In the charge trap memory, a gate dielectric film of a memory transistor has a stacked structure (an ONO structure) including a silicon dioxide film (an interlayer dielectric film), a silicon nitride film, a silicon dioxide film (a tunnel dielectric film). Charges are accumulated in discrete traps in the silicon nitride film near an interface with the silicon dioxide film (the tunnel dielectric film) on the side of the silicon substrate. This changes the threshold voltage of the memory transistor and therefore enables data to be stored therein. Such a memory transistor is referred to as a MONOS (Metal Oxide Nitride Oxide Semiconductor) or a SONOS (Silicon Oxide Nitride Oxide Semiconductor). The charge trap memory according to the present embodiment may be a charge trap memory having a so-called SONONOS structure or a so-called MONONOS structure where the silicon nitride film is replaced with another ONO structure.

In the floating gate memory, a floating gate electrode is provided between two layers of gate dielectric films of a memory transistor and data is stored therein by accumulating charges in the floating gate electrode. The floating gate memory according to the present embodiment may be a floating gate memory in which a gate dielectric film (an interlay dielectric film) on the side of a control gate is replaced with an ONO structure.

The control region 200 includes, for example, peripheral circuits other than the non-volatile memory. The control region 200 includes, for example, a control circuit, a sense amplifier, a column decoder, a row decoder, an input/output circuit, a power supply circuit, a processor such as a CPU (Central Processing Unit), various analog circuits, an external input/output circuit, and the like. The control region 200 is, for example, a region where a MOS (Metal-Oxide-Semiconductor) field-effect transistor (hereinafter, also a MOSFET or a MOS transistor) is formed. A MOSFET is formed as follows. An n-type MOS (NMOS) is generally formed by forming a silicon oxide film and a gate region thereon in a gate region on a p-type silicon substrate, and implanting a high concentration of impurity ions into drain and source regions to obtain an n-type ($n^+$-type) semiconductor. A p-type MOS (PMOS) is formed by creating a region of an n layer by ion implantation into a p-type silicon substrate, forming a silicon oxide film and a gate region thereon in a gate region of the n-type implanted region, and implanting a high concentration of impurity ions into drain and source regions to obtain a p-type ($p^+$-type) semiconductor. The MOS transistor according to the present embodiment can be either an n-type MOS (NMOS) or a p-type MOS (PMOS).

FIG. 2 is a sectional view illustrating a configuration example of the semiconductor device 1 according to the present embodiment. As illustrated in FIG. 2, the semiconductor device 1 includes a semiconductor substrate 10, and a charge trap memory transistor 2 and a MOS transistor 3 formed on the semiconductor substrate 10. Hereinafter, the charge trap memory transistor 2 is also referred to as "memory transistor 2" or "transistor 2" and the MOS transistor 3 is also referred to as "transistor 3".

For example, a silicon (Si) wafer including P-type or N-type impurities is used as the semiconductor substrate 10. N-type or P-type well regions 11 are formed in predetermined regions of the semiconductor substrate 10. For example, boron (B) is used as the P-type impurities and phosphorus (P) or antimony (Sb) is used as the N-type impurities.

The memory transistor 2 includes a first silicon dioxide film ($SiO_2$) (a tunnel dielectric film) 31, a first silicon nitride film ($Si_3N_4$) 32, a second silicon dioxide film (an interlayer dielectric film) 33, and a first gate electrode 41 positioned in order on the semiconductor substrate 10. The first silicon dioxide film ($SiO_2$) 31, the first silicon nitride film ($Si_3N_4$) 32, and the second silicon dioxide film 33 constitute an ONO structure of gate dielectric films between the semiconductor substrate and the first gate electrode 41. The first gate electrode 41 is, for example, constituted of polysilicon (polycrystalline silicon: PolySi) including doped impurities and having a conductivity. The memory transistor 2 is one example of a charge trap memory transistor and is not limited to this configuration.

A third silicon dioxide film ($SiO_2$) 35 is formed on side surfaces of the first gate electrode 41, the first silicon nitride film 32, the second silicon dioxide film 33. Sidewalls 71, 72, and 73 are formed of a silicon dioxide film ($SiO_2$) 71, a silicon nitride film ($Si_3N_4$) 72, and a silicon dioxide film ($SiO_2$) 73, respectively, in order from the side of the first gate electrode 41. An interlayer dielectric film 80 is further provided. The interlayer dielectric film 80 has openings at predetermined locations and wires 91 of aluminum (Al) or the like arranged on the interlayer dielectric film 80 are respectively connected to the gate electrode of the memory transistor 2 via plugs 92 of tungsten (W) or the like arranged in the openings of the interlayer dielectric film 80.

The N-type or P-type well regions 11 are formed in the predetermined regions in the semiconductor substrate 10. On the semiconductor substrate 10, element isolation regions 20 are formed in trenches shallowly dug in the semiconductor substrate 10. The element isolation regions 20 are, for example, STIs (Shallow Trench Isolations) and are obtained by embedding an insulating film such as a silicon dioxide film ($SiO_2$) in the trenches shallowly dug in the semiconductor substrate 10. In this way, the memory transistor 2 is formed in the element isolation regions 20, and an element region surrounded by the element isolation regions 20.

Extension regions 61 and 62, a source region 63, and a drain region 64 are formed below the sidewalls 71, 72, and 73. The extension regions 61 and 62 are also referred to as "LDDs (lightly doped drains)".

The MOS transistor 3 includes a fourth silicon dioxide film ($SiO_2$) 36 and a second gate electrode 51 positioned in order on the semiconductor substrate 10. The fourth silicon dioxide film 36 constitutes a gate dielectric film of the MOS transistor 3. The second gate electrode 51 is, for example, constituted of polysilicon (PolySi) including doped impurities and having a conductivity. The rest of the configuration can be formed, for example, to have a same configuration as that of the memory transistor 2. A metal silicide layer such as a cobalt silicide (CoSi) or a titanium silicide (TiSi) may be formed on the source region 63 and the drain region 64 of the transistors 2 and 3. The MOS transistor 3 is an example of the MOS transistor and is not limited to this configuration.

Figure 3:
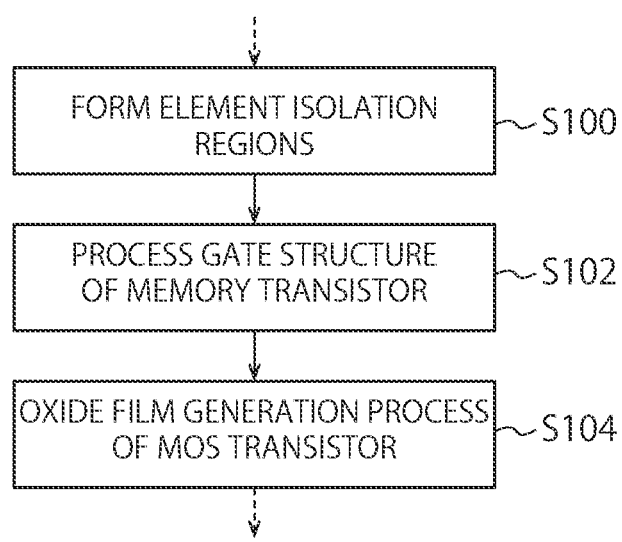
FIG. 3 is a flowchart illustrating a flow of a manufacturing method of a semiconductor device.

A manufacturing method of the semiconductor device 1 according to the present embodiment is explained below. FIG. 3 is a flowchart illustrating a flow of the manufacturing method of the semiconductor device 1 according to the present embodiment. As illustrated in FIG. 3, the element isolation regions 20 are formed in the semiconductor substrate 10 (Step S100), and the first gate electrode 41 and the ONO structure of the gate dielectric films 31, 32, and 33 of the memory transistor 2 are constituted (Step S102). Subsequently, a generation process of a gate oxide film (Step S104) is performed to constitute the fourth silicon dioxide film 36 and the second gate electrode 51.

In this way, the fourth silicon dioxide film 36 and the second gate electrode 51 of the transistor 3 are constituted after the first gate electrode 41 and the ONO structure of the gate dielectric films 31, 32, and 33 of the memory transistor 2 are constituted. In this case, influences of the manufacturing process of the memory transistor 2 on the well region 11, the fourth silicon dioxide film 36, and the second gate electrode 51 can be suppressed. For example, in the control region 200 of the semiconductor device 1, it is preferable to suppress influences on the control region 200 in a case of constituting the memory cell region 100 that is currently manufactured by the existing process and is designed later, and the like. Meanwhile, there is a risk that the oxidation treatment process (Step S104) at the time of formation of an oxide film in the transistor 3 of the control region 200, and the like affects the memory transistor 2. Therefore, the manufacturing method of the semiconductor device 1 according to the present embodiment has a process of forming a sacrificial polysilicon film on at least a part of the surface region of the first gate electrode 41 and the ONO structure of the gate dielectric films 31, 32, and 33 to prevent the oxidation treatment process at the time of formation of a gate oxide film in the transistor 3 from affecting the memory transistor 2, which will be described in detail later.

Figure 12:
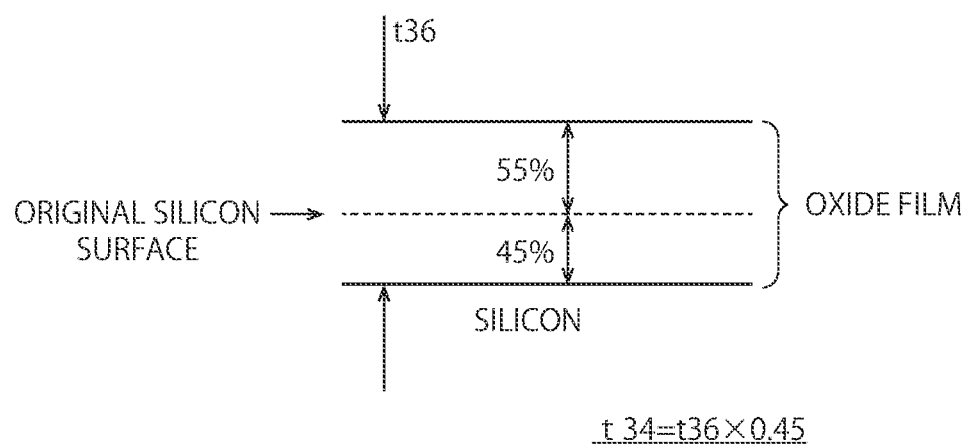
FIG. 12 is a diagram illustrating film formation characteristics of a silicon dioxide film.

FIGS. 4 to 11 and 14 to 18 are sectional views of the semiconductor device 1 according to the present embodiment in first to thirteenth processes. FIG. 12 is a diagram illustrating film formation characteristics of a silicon dioxide film. FIG. 13 are diagrams illustrating a comparison of bird's beaks.

FIG. 4 illustrates parts of a sectional view of the semiconductor substrate 10 in the first process of the semiconductor device 1 according to the present embodiment. As illustrated in FIG. 4, the first process is a process of forming the element isolation regions 20. In the first process, an insulating film such as a silicon dioxide film is embedded in trenches obtained by shallowly digging the semiconductor substrate 10 to form the element isolation regions 20. The element isolation regions 20 are formed in the semiconductor substrate 10, for example, by an STI (shallow trench isolation) method.

FIG. 5 illustrates parts of a sectional view of the semiconductor substrate 10 in the second process of the semiconductor device 1 according to the present embodiment. As illustrated in FIG. 5, the second process is a process of forming the well region 11 of the memory transistor 2.

FIG. 6 illustrates parts of a sectional view of the semiconductor substrate 10 in the third process of the semiconductor device 1 according to the present embodiment. As illustrated in FIG. 6, the third process is a process of constituting the ONO structure of the gate dielectric films 31, 32, and 33. The first silicon dioxide film 31, the first silicon nitride film 32, and the second silicon dioxide film 33 are formed in order on the semiconductor substrate 10.

In the third process, the first silicon dioxide film 31 serving as a tunnel film is first formed. For example, the first silicon dioxide film 31 is formed by thermally oxidizing the surface of the semiconductor substrate 10. The thermal oxidation treatment is performed, for example, by steam oxidation treatment using steam ($H_2O$) and oxygen or nitrogen ($N_2$). A temperature range in the thermal oxidation treatment is, for example, 650° C. to 900° C. Subsequently, the first silicon nitride film 32 serving as a charge accumulating layer is formed on the first silicon dioxide film 31. The first silicon nitride film 32 is formed, for example, by a CVD (chemical vapor deposition) method using ammonia ($NH_3$) and dichlorosilane (DCS, $SiH_2Cl_2$) as reactant gases. Next, the second silicon dioxide film 33 serving as a block film is formed on the first silicon nitride film 32. The second silicon dioxide film 33 is formed, for example, by the CVD method using dichlorosilane and nitric oxide (NO) as reactant gases.

FIG. 7 illustrates parts of a sectional view of the semiconductor substrate 10 in the fourth process of the semiconductor device 1 according to the present embodiment. As illustrated in FIG. 7, the fourth process is a process of generating a silicon dioxide film 33a on a surrounding part of the first gate electrode 41 after the first gate electrode 41 and the ONO structure of the gate dielectric films 31, 32, and 33 are constituted. The first gate electrode 41 is formed on the second silicon dioxide film 33 by patterning a conductive film. For example, a resist is applied onto the conductive film, and exposure and development are performed by a photolithography method using a photomask to form the resist. The conductive film is dry-etched using the resist as a mask to form the first gate electrode 41. Subsequently, the first silicon nitride film 32 and the second silicon dioxide film 33 in a region other than the first gate electrode 41 are removed, for example, by wet etching processing using a hot phosphoric acid and hydrofluoric acid. At this time, the silicon dioxide film 33a is formed on the upper wall and side walls of the first gate electrode 41 in some cases to protect the conductive film. The silicon dioxide film 33a is formed by thermally oxidizing the surface of the first gate electrode 41. The thermal oxidation treatment is performed, for example, by steam oxidation treatment using steam ($H_2O$) and oxygen or nitrogen ($N_2$). In the following explanations, the silicon dioxide film 33a formed to be integral with the second silicon dioxide film 33 is referred to as "second silicon dioxide film 33".

FIG. 8 illustrates parts of a sectional view of the semiconductor substrate 10 in the fifth process and a top view of the memory transistor 2 in the semiconductor device 1 according to the present embodiment. That is, the sectional view of the memory transistor 2 is a sectional view along a line A-A in the top view. As illustrated in FIG. 8, the fifth process is a process of forming a sacrificial polysilicon film 34. The sacrificial polysilicon film (polycrystalline silicon: PolySi) 34 is formed, for example, by a CVD method. The sacrificial polysilicon film 34 at this time is characterized in a thickness t34 and is formed according to a thickness t36 of the fourth silicon dioxide film 36 (see FIGS. 11 and 12 described later).

FIG. 9 illustrates parts of a sectional view of the semiconductor substrate 10 in the sixth process of the semiconductor device 1 according to the present embodiment. As illustrated in FIG. 9, the sixth process is a process of etching the sacrificial polysilicon film 34. The sacrificial polysilicon film 34 on the semiconductor substrate 10 is removed by a predetermined thickness from the upper side of the semiconductor substrate 10, for example, by dry etching. That is, the predetermined thickness of the sacrificial polysilicon film 34 is removed from the surface of the semiconductor substrate 10 in a direction indicated by an arrow Y. Accordingly, the sacrificial polysilicon film 34 is maintained in a state of being formed at least on a part of the surface region of the first gate electrode 41 and the ONO structure of the gate dielectric films 31, 32, and 33.

FIG. 10 illustrates parts of a sectional view of the semiconductor substrate 10 in the seventh process of the semiconductor device 1 according to the present embodiment. As illustrated in FIG. 10, the seventh process is a process of forming the well region 11 of the transistor 3.

FIG. 11 illustrates parts of a sectional view of the semiconductor substrate 10 in the eighth process of the semiconductor device 1 according to the present embodiment. As illustrated in FIG. 11, the eighth process is a process of generating the fourth silicon dioxide film 36. First, the first silicon dioxide film 31 of the transistor 2 is peeled off, for example, by wet etching processing (for example, hydrofluoric acid treatment). The fourth silicon dioxide film 36 is formed by thermally oxidizing the surface of the semiconductor substrate 10 of the transistor 2. The thermal oxidation treatment is performed, for example, by steam oxidation treatment using steam ($H_2O$) and oxygen or nitrogen ($N_2$). A temperature range in the thermal oxidation treatment is, for example, 650° C. to 900° C. The third silicon dioxide film 35 is an oxide film obtained by oxidizing the sacrificial polysilicon film 34 and having a thickness t35. The thickness t35 of the third silicon dioxide film 35 generated by the film formation in the eighth process is increased due to the oxidation to be larger than the thickness of the sacrificial polysilicon film 34. The thickness t35 of the third silicon dioxide film 35 is, for example, set to be the thickness t36 of the fourth silicon dioxide film 36.

As illustrated in FIG. 12, when silicon is oxidized, 45 percent of the oxidized region is formed in the silicon and 55 percent thereof is generated to have a thickness increased from the original silicon surface. More specifically, when the surface of the semiconductor substrate 10 is oxidized to form silicon dioxide ($SiO_2$), the volume of the region where the oxidized silicon region (silicon dioxide ($SiO_2$)) is formed increases. In this case, 55 percent of the formed silicon dioxide ($SiO_2$) film is formed on the surface of the semiconductor substrate 10. The remaining 45 percent of the silicon dioxide ($SiO_2$) film is formed in the semiconductor substrate 10.

Referring back to FIGS. 8 and 11, the thickness t34 of the sacrificial polysilicon film 34 is set to enable the third silicon dioxide film 35 to have a similar thickness to the thickness t36 of the silicon dioxide film generated in the eighth process. With this setting of the thickness t34 of the sacrificial polysilicon film 34, the whole sacrificial polysilicon film 34 is oxidized when the fourth silicon dioxide film 36 has the target thickness t36. In other words, when the thickness t34 of the sacrificial polysilicon film 34 is set to t36×0.45, the thickness t35 of the third silicon dioxide film 35 becomes a similar thickness to the thickness t36 of the silicon dioxide film generated in the eighth process. As is understood from this, when the thickness t34 of the sacrificial polysilicon film 34 is set to t36×0.45, generation of the fourth silicon dioxide film 36 having the target thickness and oxidation of the entire region of the sacrificial polysilicon film 34 end almost simultaneously. Accordingly, oxidation in a region covered with the sacrificial polysilicon film 34 is suppressed.

On the other hand, a region remaining in the sacrificial polysilicon film 34 without being oxidized becomes a factor that causes reduction of the breakdown voltage, or the like. Therefore, setting the thickness t34 of the sacrificial polysilicon film 34 to be larger than t36×0.45 is impermissible. The sacrificial polysilicon film 34 does not have an impact on the performance of the memory transistor 2 even when remaining. For example, the silicon dioxide film 36 can also be used as an offset spacer at the time of LDD implantation. Accordingly, it is desirable that the film thickness t34 of the sacrificial polysilicon film 34 is equal to or lower than 45 percent of the total film thickness t36 of the fourth silicon dioxide film 36 generated in the eighth process.

However, there is a risk that the oxidation gradually progresses in the silicon materials of the first gate electrode 41 and the ONO structure of the gate dielectric films 31, 32, and 33 if the sacrificial polysilicon film 34 is thinned to be thinner than t36×0.45. Therefore, the film thickness t34 of the sacrificial polysilicon film 34 according to the present embodiment is set to, for example, not more than 45 percent of the total film thickness t36 generated in the eighth process and not less than 35 percent thereof as a selective configuration example. This enables progress of the oxidation in the region of the first gate electrode 41 and the ONO structure of the gate dielectric films 31, 32, and 33 covered with the sacrificial polysilicon film 34 to be suppressed and can suppress occurrence of a bird's beak. The value of 35 percent according to the present embodiment is an example and the film thickness t34 of the sacrificial polysilicon film 34 is not limited to not less than 35 percent of the total film thickness t36 generated in the eighth process. For example, it suffices that the film thickness t34 of the sacrificial polysilicon film 34 is larger than zero percent of the total film thickness t36 generated in the eighth process. Accordingly, gradual progress of the oxidation in the silicon materials of the first gate electrode 41 and the ONO structure of the gate dielectric films 31, 32, and 33 is suppressed by the sacrificial polysilicon film 34 without the sacrificial polysilicon film 34 remaining unoxidized.

The left drawing in FIG. 13 is a sectional view of the gate dielectric films 31, 32, and 33 in a case in which the thickness of the sacrificial polysilicon film 34 is 45 percent and the right drawing is a sectional view of the gate dielectric films 31, 32, and 33 in a case in which the sacrificial polysilicon film 34 is not provided. In the left drawing in FIG. 13, all film thicknesses of the gate dielectric films 31, 32, and 33 are uniform and are ideal in terms of the performance. On the other hand, in the right drawing in FIG. 13, the oxidation gradually progresses in the first gate electrode 41 and the gate dielectric films 31, 32, and 33, so that, for example, silicon dioxide ($SiO_2$) is formed, the first gate electrode 41 deforms, and the thickness of at least any of the gate dielectric films 31, 32, and 33 increases. In this way, a region where the volume is increased is produced due to bird's beaks. A bird's beak according to the present embodiment means gradual progress (sneaking) of the oxidation. Particularly, a bird's beak is likely to be generated in edge regions. If such a bird's beak is generated, the performance of the memory transistor 2 degrades.

Return to the rest of the explanations of the manufacturing process of the semiconductor device 1. FIG. 14 illustrates parts of a sectional view of the semiconductor substrate 10 in the ninth process of the semiconductor device 1 according to the present embodiment. As illustrated in FIG. 14, the ninth process is a process of forming the second gate electrode 51 of the transistor 3. The second gate electrode 51 is formed on the fourth silicon dioxide film 36 by patterning a conductive film. For example, a resist is applied onto the conductive film, and exposure and development are performed by a photolithography method using a photomask to form the resist. The second gate electrode 51 is formed by dry-etching the conductive film using the resist as a mask.

FIG. 15 illustrates parts of a sectional view of the semiconductor substrate 10 in the tenth process of the semiconductor device 1 according to the present embodiment. As illustrated in FIG. 15, the tenth process is a process of forming the extension regions 61 and 62 of the transistor 2. For example, a dopant (for example, ions of impurities such as arsenic or phosphorus) required to form the extension regions 61 and 62 is implanted into the semiconductor substrate 10 of the transistor 2.

Figure 16:
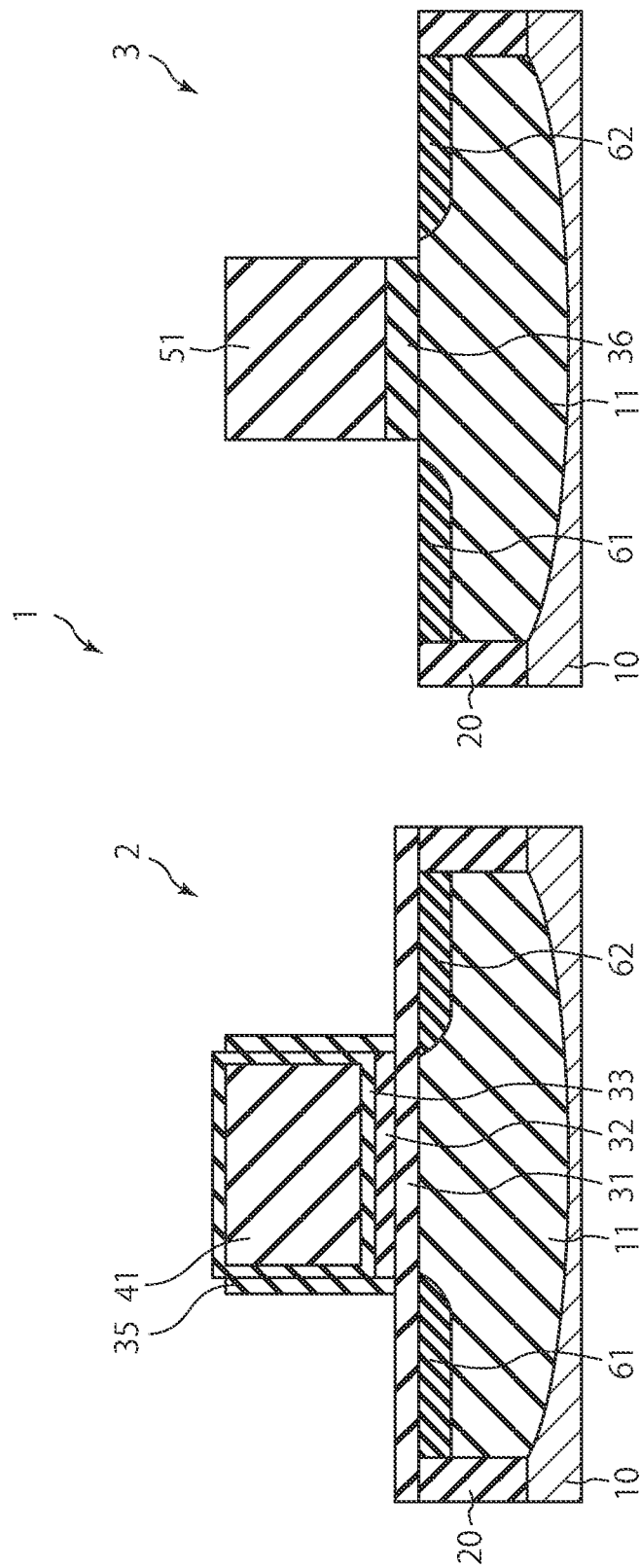
FIG. 16 is a sectional view of the semiconductor substrate in an eleventh process of the semiconductor device.

FIG. 16 illustrates parts of a sectional view of the semiconductor substrate 10 in the eleventh process of the semiconductor device 1 according to the present embodiment. As illustrated in FIG. 16, the eleventh process is a process of forming the extension regions 61 and 62 of the transistor 3. For example, a dopant (for example, ions of impurities such as arsenic or phosphorus) required to form the extension regions 61 and 62 is implanted into the semiconductor substrate 10 of the transistor 3.

FIG. 17 illustrates parts of a sectional view of the semiconductor substrate 10 in the twelfth process of the semiconductor device 1 according to the present embodiment. As illustrated in FIG. 17, the twelfth process is a process of forming the sidewalls 71, 72, and 73 of the transistors 2 and 3.

FIG. 18 illustrates parts of a sectional view of the semiconductor substrate 10 in the thirteenth process of the semiconductor device 1 according to the present embodiment. As illustrated in FIG. 18, the thirteenth process is a process of forming the sources 63 and the drains 64 of the transistors 2 and 3. The interlayer dielectric film 80 is formed after the thirteenth process, and openings are formed by processing the interlayer dielectric film 80. Subsequently, as illustrated in FIG. 2, the wires 91 such as aluminum (Al) arranged on the interlayer dielectric film are connected to the gate electrodes of the transistors 2 and 3 via the plugs 92 such as tungsten (W) arranged in the openings of the interlayer dielectric film 80, respectively.

As described above, after at least the first silicon dioxide film ($SiO_2$) (the tunnel dielectric film) 31 and the first gate electrode 41 are formed in the memory cell region 100 of the semiconductor substrate the sacrificial polysilicon film 34 is formed in the surface region for the purpose of protecting the semiconductor substrate 10, and the fourth silicon dioxide film ($SiO_2$) 36 (the gate dielectric film) is formed in the control region 200. Accordingly, even when oxidation treatment is performed to form the fourth silicon dioxide film ($SiO_2$) 36, gradual progress of the oxidation in the first silicon dioxide film ($SiO_2$) (the tunnel dielectric film) 31 and the first gate electrode 41 in the region covered with the sacrificial polysilicon film 34 can be suppressed. The thickness t34 of the sacrificial polysilicon film 34 is set to a thickness according to the total film thickness t36 of the fourth silicon dioxide film 36 generated by subsequent oxidation treatment (the eighth process). This enables the timing when generation of the fourth silicon dioxide film 36 having a target thickness ends and the timing when oxidation in the entire region of the sacrificial polysilicon film 34 ends to be matched. Therefore, progress of the oxidation into the region where the surface is covered with the sacrificial polysilicon film 34 can be suppressed with no unoxidized region remaining in the sacrificial polysilicon film 34. By thus setting the thickness t34 of the sacrificial polysilicon film 34 to a thickness according to the total film thickness t36 of the fourth silicon dioxide film 36 generated by the subsequent oxidation treatment (the eighth process), generation of a bird's beak in a predetermined region can be suppressed even when the oxidation treatment is performed.

First Modification of First Embodiment

A manufacturing method of the semiconductor device 1 according to a first modification is different from the manufacturing method of the semiconductor device 1 according to the first embodiment in further forming a resist 82 in the memory transistor 2 in the process of forming the sacrificial polysilicon film 34 in the fifth process (FIG. 8). Differences between the manufacturing method of the semiconductor device 1 according to the first embodiment and the manufacturing method of the semiconductor device 1 according to the first modification are described below.

Figure 19:
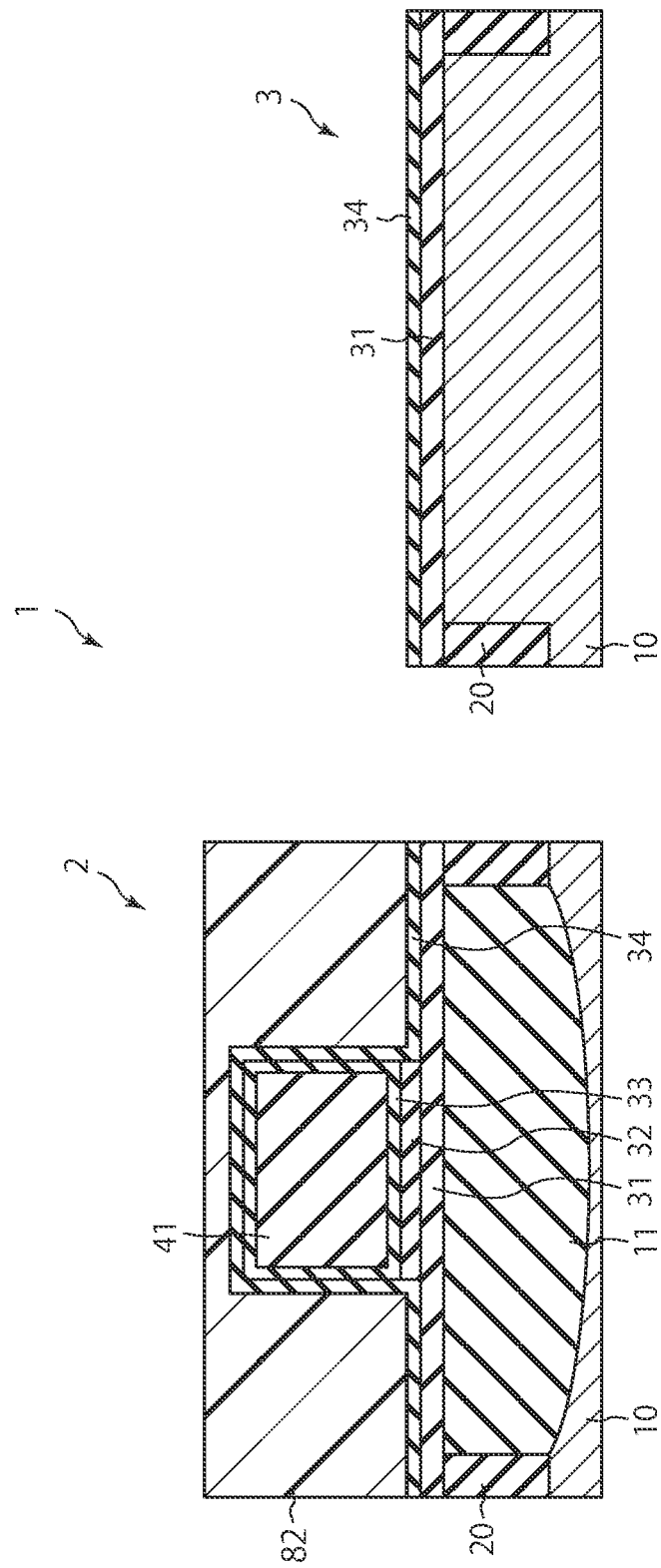
FIG. 19 is a sectional view of a semiconductor substrate in a fifth process of an embodiment according to a first modification.

FIG. 19 is a sectional view of the semiconductor substrate 10 in a fifth process of an embodiment according to the first modification of the first embodiment. As illustrated in FIG. 19, the resist 82 is stacked on the memory transistor 2.

FIG. 20 is a sectional view of the semiconductor substrate 10 in a sixth process according to the first modification of the first embodiment. As illustrated in FIG. 20, the sixth process according to the first modification of the first embodiment is a process of etching the sacrificial polysilicon film 34. The sacrificial polysilicon film 34 on the transistor 3 is removed, for example, by dry etching. In this case, the sixth process is different from that in the manufacturing method of the semiconductor device 1 according to the first embodiment in that the resist 82 prevents the whole film of the sacrificial polysilicon film 34 on the transistor 3 from being removed by the etching.

Figure 21:
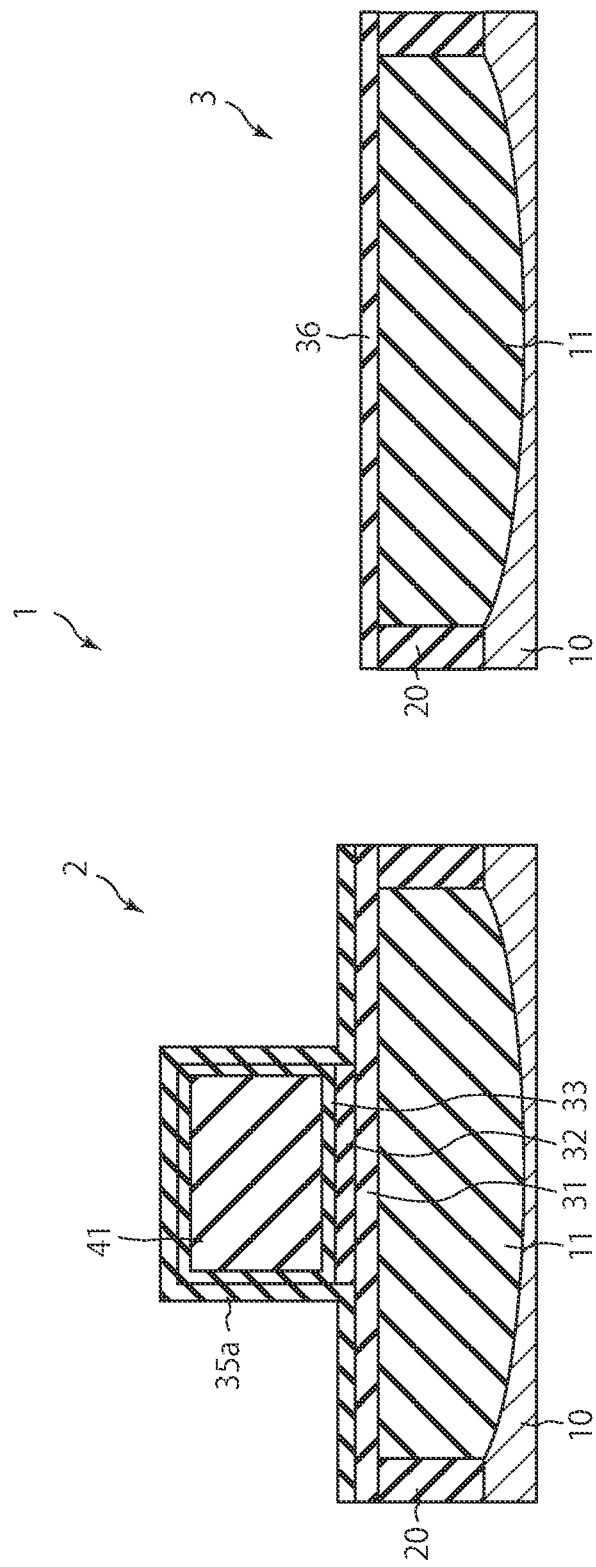
FIG. 21 is a sectional view of the semiconductor substrate in an eighth process of the embodiment according to the first modification.

FIG. 21 illustrates parts of a sectional view of the semiconductor substrate 10 in an eighth process according to the first modification of the first embodiment. As illustrated in FIG. 21, an oxide film 35a covering the upper surface of the transistor 2 is formed in the eighth process according to the first modification of the first embodiment.

In this way, in the manufacturing method of the semiconductor device 1 according to the first modification of the first embodiment, the whole of the sacrificial polysilicon film 34 on the transistor 2 is maintained when the sacrificial polysilicon film 34 on the transistor 3 is removed by etching. Therefore, gradual progress of the oxidation in the upper surface of the transistor 2 can be suppressed in the process of generating the fourth silicon dioxide film 36.

Second Modification of First Embodiment

A second modification of the first embodiment is different from the first embodiment in that the memory transistor 2 is a floating gate memory transistor 4. Differences between the semiconductor device 1 according to the first embodiment or the first modification and the semiconductor device 1 according to the second modification are described below.

Figure 22:
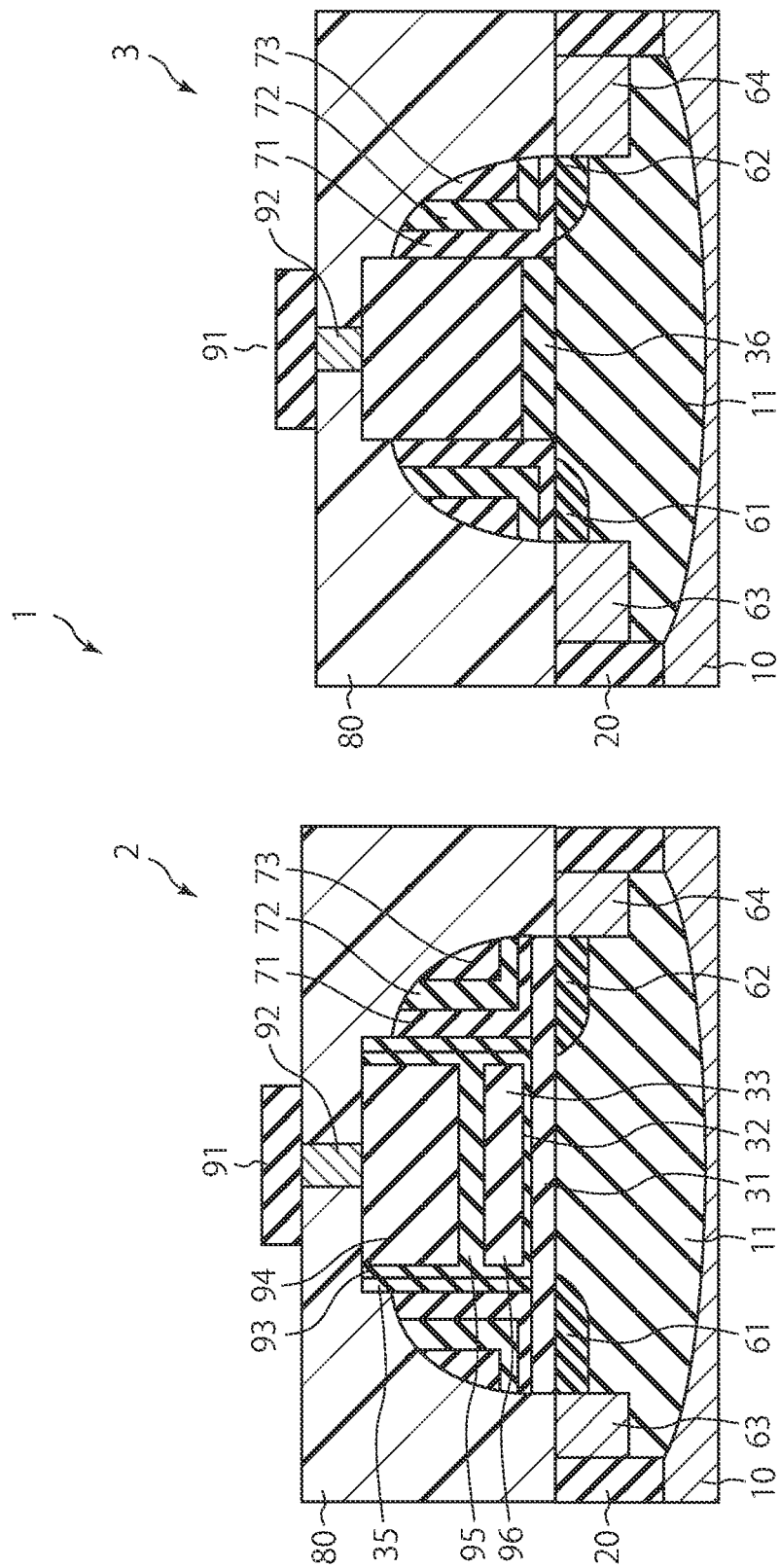
FIG. 22 is a sectional view illustrating a configuration example of a semiconductor device according to a second modification of the first embodiment.

FIG. 22 is a sectional view illustrating a configuration example of the semiconductor device 1 according to the second modification of the first embodiment. As illustrated in FIG. 22, the semiconductor device 1 includes the semiconductor substrate 10, the floating gate memory transistor 4 formed on the semiconductor substrate 10, and the MOS transistor 3. The memory transistor 4 is one example of the floating gate memory transistor and the memory transistor 4 is not limited to this configuration.

The memory transistor 4 is different from the charge trap memory transistor 2 in including the silicon dioxide film 31, a third gate electrode 94 made of polysilicon, a silicon dioxide film (an interlayer dielectric film) 95, and a floating gate electrode 96.

FIG. 23 illustrates parts of a sectional view of the semiconductor substrate 10 in a fourth process of the semiconductor device 1 according to the second modification of the first embodiment. As illustrated in FIG. 23, the fourth process according to the second modification of the first embodiment is a process of forming the third gate electrode 94, the silicon dioxide film (the interlayer dielectric film) 95, and the floating gate electrode 96, and subsequently generating a silicon dioxide film on the periphery of the third gate electrode 94 and the floating gate electrode 96. The rest of the manufacturing procedure is similar to that of the semiconductor device 1 according to the first embodiment, or the first modification of the first embodiment. Therefore, explanations thereof are omitted. Since the sacrificial polysilicon film 34 is thus formed after the third gate electrode 94, the silicon dioxide film (the interlayer dielectric film) 95, and the floating gate electrode 96 are formed, generation of a bird's beak can be suppressed even when the fourth silicon dioxide film 36 is formed.

While certain embodiments have been described, these embodiments have been presented by way of example only, and are not intended to limit the scope of the inventions. Indeed, the novel embodiments described herein may be embodied in a variety of other forms and various omissions, substitutions, and changes may be made without departing from the spirit of the inventions. The embodiments and their modifications are intended to be included in the scope and the spirit of the invention and also in the scope of the invention and their equivalents described in the claims.

The invention claimed is:

1. A manufacturing method of a semiconductor device comprising a memory transistor having at least a first silicon dioxide film and a first gate electrode positioned on a semiconductor substrate in order, and a MOS transistor having a second silicon dioxide film and a second gate electrode positioned on the semiconductor substrate in order, the method comprising:
   a first process of forming at least a first silicon dioxide film and a first gate electrode in a first region of a semiconductor substrate;
   a second process of forming a sacrificial polysilicon film in at least a part of a surface region covering the first silicon dioxide film and the first gate electrode;
   and a third process of forming a gate dielectric film of a second silicon dioxide film in a second region different from the first region of the semiconductor substrate by performing a thermal oxidization of the second region of the semiconductor substrate along with a region of the sacrificial polysilicon film,
   wherein a thickness of the sacrificial polysilicon film before the thermal oxidization is not more than 45 percent of a thickness of the second silicon dioxide film formed by the thermal oxidization.

2. The method of claim 1, wherein the thickness of the sacrificial polysilicon film before the thermal oxidization is not less than 35 percent of the thickness of the second silicon dioxide film formed by the thermal oxidization.

3. The method of claim 1, wherein the first process comprises generating the first silicon dioxide film, a first silicon nitride film, a third silicon dioxide film, and the first gate electrode.

4. The method of claim 1, wherein the first process comprises generating the first silicon dioxide film, a floating gate electrode, a fourth silicon dioxide film, and the first gate electrode.

5. The method of claim 1, wherein the second process comprises
   forming the sacrificial polysilicon film on the semiconductor substrate, and
   removing a predetermined thickness of the sacrificial polysilicon film from an upper side on the semiconductor substrate.

6. The method of claim 1, wherein the second process comprises
   forming the sacrificial polysilicon film on the semiconductor substrate, and
   removing the sacrificial polysilicon film on the second region.

7. The method of claim 5, wherein a predetermined thickness of the sacrificial polysilicon film is removed from an upper side on the semiconductor substrate to cause the sacrificial polysilicon film in contact with the first silicon dioxide film and side surfaces of the first gate electrode to remain.

\* \* \* \* \*